US009705285B2

(12) United States Patent
Kalosha et al.

(10) Patent No.: US 9,705,285 B2
(45) Date of Patent: Jul. 11, 2017

(54) DEVICE COMPRISING A HIGH BRIGHTNESS BROAD-AREA EDGE-EMITTING SEMICONDUCTOR LASER AND METHOD OF MAKING THE SAME

(71) Applicant: Technische Universität Berlin, Berlin (DE)

(72) Inventors: Vladimir Kalosha, Berlin (DE); Dieter Bimberg, Berlin (DE)

(73) Assignee: Technische Universität Berlin, Berlin (DE)

( * ) Notice: Subject to any disclaimer, the term of this patent is extended or adjusted under 35 U.S.C. 154(b) by 78 days.

(21) Appl. No.: 14/169,520

(22) Filed: Jan. 31, 2014

(65) Prior Publication Data

US 2015/0288147 A1    Oct. 8, 2015

(51) Int. Cl.
| | | |
|---|---|---|
| H01S 5/20 | (2006.01) |
| H01S 5/32 | (2006.01) |
| H01S 5/34 | (2006.01) |
| H01S 5/347 | (2006.01) |
| H01S 5/343 | (2006.01) |

(52) U.S. Cl.
CPC ......... H01S 5/2031 (2013.01); H01S 5/2036 (2013.01); H01S 5/3213 (2013.01); H01S 5/34 (2013.01); H01S 5/347 (2013.01); *H01S 5/205* (2013.01); *H01S 5/3211* (2013.01); *H01S 5/3216* (2013.01); *H01S 5/34313* (2013.01); *H01S 2301/166* (2013.01); *H01S 2301/18* (2013.01)

(58) Field of Classification Search
CPC ............ H01S 2301/18; H01S 2301/16; H01S 5/2031; H01S 5/3213; H01S 5/3215
See application file for complete search history.

(56) References Cited

U.S. PATENT DOCUMENTS

| | | |
|---|---|---|
| 2003/0210720 A1 | 11/2003 | Reid |
| 2004/0208213 A1* | 10/2004 | Lichtenstein ............ H01S 5/20 372/45.012 |
| 2005/0201437 A1 | 9/2005 | Reid et al. |
| 2012/0201262 A1 | 8/2012 | Schillgalies et al. |
| 2012/0263205 A1 | 10/2012 | Gomez-Iglesias et al. |

OTHER PUBLICATIONS

European Search Report dated Sep. 9, 2015 issued in European Application No. 15152286.9.
A. Al-Muhanna, L. J. Mawst, and D. Botez, D. Z. Garbuzov, R. U. Martinelli, and J. C. Connolly, "High-power (>10 W) continuous-wave operation from 100-mm-aperture 0.97-mm-emitting Al-free diode lasers", Appl. Phys. Lett. vol. 73, No. 9, pp. 1182-1184 (1998).

(Continued)

*Primary Examiner* — Marcia Golub-Miller
(74) *Attorney, Agent, or Firm* — Gorgon & Rees LLP

(57) ABSTRACT

Device comprising a high brightness broad-area edge-emitting semiconductor laser and method of making the same. The device includes an edge-emitting semiconductor laser, said laser having a multi-layered waveguide, and said waveguide comprising at least one layer with an active region that emits light under electrical injection, and at least one aperiodic layer stack.

5 Claims, 12 Drawing Sheets

(56) References Cited

OTHER PUBLICATIONS

A. P. Bogatov, T. I. Gushchik, A. E. Drakin, A. P. Nekrasov and V. V. Popovichev, "Optimization of waveguide parameters of laser InGaAs/AlGaAs/GaAs heterostructures for obtaining the maximum beam width in the resonator and the maximum output power", Quantum Electron. vol. 38, No. 10, pp. 935-939 (2008).

K. Posilovic, T. Kettler, V. A. Shchukin, N. N. Ledentsov, U. W. Pohl, D. Bimberg, J. Fricke, A. Ginolas, G. Erbert, G. Tränkle, J. Jönsson, and M. Weyers, "Ultrahigh-brightness 850 nm GaAs/AlGaAs photonic crystal laser diodes", Appl. Phys. Lett. vol. 93, No. 221102 (2008).

M. V. Maximov, Y. M. Shernyakov, I. I. Novikov, S. M. Kuznetsov, L. Y. Karachinsky, N. Y. Gordeev, V. P. Kalosha, V. A. Shchukin, and N. N. Ledentsov, "High performance 640 nm-range GaInP/AlGaInP lasers based on the longitudinal photonic bandgap crystal with narrow vertical beam divergence", IEEE J. Quantum Electron. vol. 41, No. 11, pp. 1341-1348 (2005).

N. A. Pikhtin, S. O. Slipchenko, Z. N. Sokolova, A. L. Stankevich, D. A. Vinokurov, I. S. Tarasov, ZH. I. Alferov, "16 W continuous-wave output power from 1003BCm-aperture laser with quantum well asymmetric heterostructure", Electron. Lett. vol. 40. No. 22, pp. 1413-1414 (2004).

N. N. Ledentsov and V. A. Shchukin, "Novel concepts for injection lasers", Opt. Eng. vol. 41, No. 12, pp. 3193-3203 (2002).

P. Crump, A. Pietrzak, F. Bugge, H. Wenzel, G. Erbert, and G. Tränkle, "975 nm high power diode lasers with high efficiency and narrow vertical far field enabled by low index quantum barriers", Appl. Phys. Lett. vol. 96, No. 131110 (2010).

P. M. Smowton, G. M. Lewis, M. Yin, H. D. Summers, G. Berry, and C. C. Button, "650-nm lasers with narrow far-field divergence with integrated optical mode expansion layers", IEEE J. Sel. Top. Quantum Electron. vol. 5, No. 3, pp. 735-739 (1999).

R. Scifres, W. Streifer, and R. D. Burnham, "Leaky wave room-temperature double heterostructure GaAs/GaAlAs diode laser", Appl. Phys. Lett. vol. 29, No. 1, pp. 23-25 (1976).

S. L. Chuang, Physics of Optoelectronics Devices, John Wiley, New York (1995), pp. 273-278.

V. Shchukin, N. Ledentsov, K. Posilovic, V. Kalosha, T. Kettler, D. Seidlitz, M. Winterfeldt, D. Bimberg, N. Y. Gordeev, L. Y. Karachinsky, I. I. Novikov, Y. M. Shernyakov, A.V. Chunareva, M. V. Maximov, F. Bugge, and M. Weyers, "Tilted Wave Lasers: A Way to High Brightness Sources of Light", IEEE J. Quantum Electron. vol. 47, No. 7, pp. 1014-1027 (2011).

W. Schulz and R.Poprawe, "Manufacturing with novel high-power diode lasers", IEEE J. Sel. Top. Quantum Electron. vol. 6, No. 4, pp. 696-705 (2000).

W. Streifer, R. D. Burnham, and D. R. Scifres, "Substrate radiation losses in GaAs heterostructure lasers", IEEE J. Quantum Electron. vol. 12, No. 3, pp. 177-182 (1976).

\* cited by examiner

US 9,705,285 B2

DEVICE COMPRISING A HIGH BRIGHTNESS BROAD-AREA EDGE-EMITTING SEMICONDUCTOR LASER AND METHOD OF MAKING THE SAME

BACKGROUND

High brightness edge-emitting semiconductor lasers are characterized by high power and low beam divergence of the output radiation and play a decisive role for a variety of applications. Standard edge-emitting semiconductor lasers comprise an epitaxial waveguide providing a tight confinement of the guided modes in sub-μm areas and hence large divergence of the output beam. Therefore the brightness of such lasers is low, additionally restricted by the power which cannot be substantially increased for small-area waveguides due to onset of the nonlinear optical effects.

High brightness edge-emitting semiconductor lasers are lasers, which are characterized by high power and low beam divergence of the output radiation. These semiconductor optical sources play an important role in a variety of applications including, for example, industrial material processing, pumping of fiber amplifiers, fiber and solid state lasers, free space communication, second harmonic generation, medicine, laser printing, lidar, etc. [1]. The emission of high brightness lasers has a slowly varying spot size across significant propagation distances (far-field zone) and is thus suitable for a large variety of direct applications, without using complicated external optical focusing units, such reducing the cost of the systems.

High brightness lasers are emitting high power and simultaneously have small divergence of the radiation in both vertical direction (direction of the epitaxial growth) and lateral direction (parallel to the epitaxial plane). The brightness B of a laser source is generally understood as the power P divided by the mode area in the focus $A=\pi w^2$ (w is the radius of the beam waist) and the spatial solid angle in the far-field $\Theta$: $B=P/A\Theta$. For non-diffraction-limited beams the brightness is reduced by the product of the $M^2$ factors of the beam quality for the vertical and lateral directions. The $M^2$ factor is defined as the product of beam radius at the beam waist and the far-field beam divergence angle divided by the corresponding product for a diffraction-limited Gaussian beam with the same wavelength: $M^2=w\Theta/(2\lambda/\pi)$.

Typical broad area edge-emitting lasers have a large divergence in the vertical direction (FIG. 1) and a low beam quality in the lateral direction. They consist typically of a vertical sub-μm-sized single-mode epitaxial layer waveguide of III-V or II-VI semiconductor materials and a laterally etched multi-mode waveguide of a width of several tens of μm. The far-field divergence of such lasers in the vertical direction is typically more than 50° due to tight localization of the mode at the thin waveguide layer (4) including the active region. Widening of the vertical extension of the laser waveguide as well as increasing the lateral size of the laser stripe is used to obtain an increased output of the laser. This results in an increased beam quality factor $M^2 \gg 1$ in both directions due to the inevitable emission of a multitude of higher order modes. Such a radiation cannot be focused to a small spot, needed for most applications, even using complicated external focusing optical systems.

Some approaches are known to decrease the beam divergence of semiconductor edge-emitting lasers in the vertical direction and to increase the brightness. Design of 650 nm GaInP/AlGaInP laser diodes was reported with two separate mode expansion layers at both sides around the active layer (FIG. 2) which have vertical far-field divergence of 24° without sacrificing threshold or threshold current temperature dependence [2]. The choice of the thickness and the refractive index (defined by the material composition) of the expansion layers is governed by the effective index of the mode, which should be close to the refractive index of these layers.

Ultra-wide waveguides based on AlGaAs/GaAs/InGaAs quantum-well heterostructures with a multitude of vertical guided modes could generate a single fundamental vertical mode at 1080 nm by asymmetric positioning of the active layers with respect to the waveguide center (FIG. 3) [3]. Asymmetric positioning results in a substantial decrease of the confinement factors for the higher order modes and provides selection of the fundamental mode. An output power of 16 W in continuous-wave operation with a vertical divergence of 31° of the vertical fundamental mode was demonstrated showing a wall-plug efficiency of 74% for a 3 mm long and 100 μm (laterally multi-mode) wide stripe, having an internal loss of as low as 0.34 $cm^{-1}$.

In Ref [4] AlGaAs/GaAs/InGaAs quantum-well heterostructures were used to fabricate laser waveguides with thick expanding layer below the active layer with a refractive index close to the effective index of the fundamental mode (FIG. 4). 0.5 W power was obtained with low divergence of 11-12°. No mode selectivity was considered for the proposed thick waveguide.

The methods reported in Refs. [2-4] are suffering from growth precision issues for the expanding and active layers, when small changes of their thicknesses and/or compositions cause substantial changes of the mode selection. The same refers to temperature effects, which change the refractive index ratio of the layers and modify the modal content of the output.

A concept of a large optical cavity based on a GaAs/AlGaAs waveguide in the vertical direction with very low index contrast between active layer and waveguide layers (layers (4) and (3), (5) in FIG. 1) was proposed (see Refs. [5-6] and references therein). The low index contrast along with the asymmetric positioning of the active layer (as in FIG. 3) stimulates guiding of a broad and single fundamental mode and allows for large output power of high beam quality. This concept has resulted in ~10 W single-mode power and a vertical beam divergence of ~30° (95% power content) for 90 μm stripe laser [6].

Another concept for high brightness semiconductor lasers employs a thick vertical waveguide formed by a periodic multi-layered GaAs/AlGaAs sequence known as a vertical photonic bandgap crystal arrangement (FIG. 5) [7-9]. This sequence and a defect region, distorting the periodicity, were designed in a way that the fundamental mode is localized at the defect, whereas the higher order modes are extending across the entire periodic region and have small confinement factors. This approach has allowed generating a narrow vertical beam divergence down to 5° at different wavelength ranges from the visible to the near-infrared. A single mode continuous-wave output power of 2.1 W at 980 nm, and as a result, highest brightness to date for conventional semiconductor lasers of 0.35 $GW/cm^2 sr$ was reported [9]. However, further increase of the power is hindered owing to high optical losses and series resistance of the lasers which are caused by the large number of the interfaces peculiar to these waveguides.

An alternative concept is based on a leaky wave laser design [9-11] providing output of the laser emission through a thick transparent substrate with extremely narrow beam divergence of <1° (FIG. 6). Development of this concept has been restrained by the existence, besides of such a low divergence beam from the substrate, also of an additional large divergence beam coming from a conventional narrow vertical waveguide including the gain medium (FIG. 6 (c)). The latter typically contains a considerable fraction of the output power and no high output power of the leaky wave lasers in the substrate mode was reported yet.

SUMMARY

The present invention pertains to the field of semiconductor lasers, and more particularly to high brightness edge-emitting semiconductor laser diodes. In more detail, the invention refers to such diodes which emit high power with narrow divergence of the laser beam in the direction of the epitaxial growth.

Different approaches were reported to decrease the beam divergence of edge-emitting lasers in the vertical direction (direction of the epitaxial growth). Some of them use additional layers in the epitaxial waveguides to expand the modes of the laser waveguide [2]. Asymmetric positioning of the layer with the active region in a large-area waveguide with low refractive index contrast is also known to discriminate the higher order modes by the confinement factor in favor of the fundamental mode [3-6]. Another concept for high brightness semiconductor lasers employs a thick vertical waveguide formed by a periodic multi-layered sequence known as a vertical photonic bandgap crystal [7-9]. By using an additional layer in the laser waveguide it was attempted to enhance the leakage of the fundamental mode and obtain lasing of the leaky mode only [10-12]. However, the methods known to date have not resulted in the expected low-divergence output of high beam quality as well as are highly sensitive to the epitaxial growth tolerances and temperature changes.

In contrast to the previous art, introducing aperiodic multi-layered sequences into epitaxial waveguides, as disclosed in the present patent application, provides plenty of possibilities to control the mode localization and simultaneously the mode leakage to achieve low divergent high power of the single fundamental mode and hence high beam quality and high brightness lasing of the edge-emitting lasers.

This application discloses method and apparatus of novel high brightness broad-area edge-emitting semiconductor lasers, which provide high power and simultaneously small divergence of the output radiation in the vertical direction. The laser consists of an epitaxial waveguide containing multiple layers, forming thick aperiodic sequences which provide the following effects:

Thicknesses and refractive indices of all the layers as function of the vertical distance are adjusted in such a way that they provide sole localization of the fundamental mode at the layer containing the active region and localization of all higher order modes predominantly at multiple absorbing layers.

The fundamental mode is expanded to the whole thick area of the multiple layers.

These additional layers are designed to provide higher leakage losses into the substrate and/or contact layer for all higher order modes as compared to the fundamental mode.

The mode selection is enhanced by the free-carrier absorption of the modes due to non-uniform doping profiles in the layer sequences when the sequence layers adjacent to the substrate and/or to the contact layer are doped heavier than the region in and around the layer with the active region. Then the difference in the total losses between the fundamental mode and the higher order modes becomes more pronounced.

Thus, because of the mode selection, first, by the confinement factor and, second, by the leakage losses in favor of the fundamental mode expanded into a broad-area waveguide, the output radiation is single-mode and results in a single-lobe far field with small divergence in the vertical direction. Since the power density per facet area is decreased upon broadening the waveguide and immunity to most of the limiting nonlinear optical effects is increased, the output power is increased and orders of magnitude larger brightness of the output radiation is obtained as compared to previous state of the art.

This application discloses method and apparatus of producing high brightness broad-area edge-emitting semiconductor lasers, which provide high power and simultaneously small divergence of the output radiation in the direction of the epitaxial growth (vertical direction). The laser consists of an epitaxial waveguide containing the active region and multiple layers, stacked on a high refractive index substrate in the direction perpendicular to the light propagation, forming thick aperiodic sequences. Thicknesses and refractive indices of all the layers as function of the vertical distance are adjusted to provide sole localization of the fundamental mode at the layer containing the active region and localization of all higher order modes predominantly at the multiple layers. Additionally, the fundamental mode is expanded to the whole thick area of the multiple layers. Furthermore, these additional layers are designed to provide much higher leakage losses into the substrate and/or contact layer for all higher order modes as compared to the fundamental mode. The discrimination is enhanced by free-carrier absorption when non-uniform doping profiles are used in the layer sequences with larger doping concentration in the areas of predominant localization of the higher order modes. Thus, because of the selection via the confinement factor and the leakage losses in favor of the fundamental mode which is expanded into a broad-area waveguide, the output radiation is single-mode and results in a single-lobe far field with small divergence in the vertical direction. Since the power density per facet area is decreased upon broadening the waveguide and immunity to most of the limiting nonlinear optical effects is increased, the output power is increased and orders of magnitude larger brightness of the output radiation is obtained as compared to previous state of the art.

In the present application ways are disclosed to obtain both high vertical beam quality combined with large output power and hence to obtain higher brightness than hitherto achieved for edge emitting semiconductor lasers as attractive laser sources for an expanding range of application. The aim is achieved by employing a layer containing an active region and multiple epitaxial layers, stacked on a high refractive index substrate in the direction perpendicular to the light propagation, forming aperiodic sequences. Thicknesses and refractive indices of all the layers as functions of the vertical distance are adjusted to provide localization of the fundamental mode predominantly at the layer containing the active region and at the same time localization of all higher order modes predominantly at the multiple epitaxial layers. Additionally, the fundamental mode is expanded to the whole area of the multiple layers, giving rise to a broad-area near field of the mode and consequently to a small divergence in the far field zone. Furthermore, the multiple layers are adjusted to provide high leakage losses into the substrate and/or contact layer of all higher order modes as compared to that of the fundamental mode. Larger confinement factor and smaller leakage loss cause mode discrimination in favor of the fundamental mode. The discrimination is enhanced by free-carrier absorption when non-uniform doping profiles are used in the layer sequences with larger doping concentration in the areas of predominant localization of the higher order modes. Therefore, the output beam shape is single-lobe and has a narrow far-field divergence in the vertical direction. Additionally, owing to the broader mode and lower power density per facet, the onset of limiting nonlinear optical effects occurs at higher power. Hence, the laser output is increased and orders of magnitude larger brightness of the output radiation is obtained as compared to previous state of the art.

This application proposes a novel way how to fabricate high brightness edge-emitting semiconductor lasers, providing high power and simultaneously small divergence of the output radiation in the vertical direction (direction of the epitaxial growth). The invention is based on the realization that a laser waveguide consisting of a layer with an active region and multiple epitaxial layers, which are stacked on top of a high refractive index substrate in the direction perpendicular to the light propagation forming specific aperiodic sequences with a proper choice of the thicknesses and refractive indices of all the layers as functions of the vertical distance, providing expansion of the fundamental mode and attenuation of the higher order modes. The expanded fundamental mode is localized predominantly at the layer containing the active region and all higher order modes predominantly at the multiple layers. The multiple epitaxial layers are adjusted to provide also higher leakage losses into the substrate and/or contact layer of all higher order modes as compared to that of the fundamental mode. Localization of the modes and their leakage are controlled by the relations between the effective indices of the modes and the refractive indices of the active layer and the substrate (and/or contact layer), respectively. Because of selection by the confinement factor and the leakage losses in favor of the fundamental mode, the output radiation is single-mode and results in a single-lobe far field with small divergence in the vertical direction. Since the power density per facet area is decreased upon broadening the waveguide and expanding the fundamental mode, high power output is also made possible before the onset of thermal and current spreading, catastrophic optical mirror damage and other nonlinear optical effects. The invention is applicable to essentially any semiconductor laser diode system based on (Al, Ga, In)(As, P, Sb, N) or other semiconductor heterostructures emitting in the infra-red, red, visible or UV wavelength ranges.

BRIEF DESCRIPTION OF THE DRAWINGS

FIG. 2 shows a schematic diagram of prior art device [2]: (a) Cross-section view of an edge-emitting laser in the vertical and longitudinal directions as in FIG. 1 and with additional mode expanding layers (11), (12) below and above the active layer, respectively. Refractive index, thicknesses and positions of the mode expansion layers (11) and (12) are adjusted to obtain the mode expansion. (b) Near field profile of the expanded fundamental mode with additional expansion peaks (21) and (22) versus the vertical distance. (c) Far field profile of the fundamental mode with narrower divergence as compared to FIG. 1 versus the vertical angular coordinate.

FIG. 3 shows a schematic diagram of prior art device [3]: (a) Cross-section view of an edge-emitting laser in the vertical and longitudinal directions as in FIG. 1 with asymmetric positioning of the active layer (4) in the waveguide layers (11) and (12) between the substrate and contact layers (2) and (6). For appropriate asymmetric shift of the active layer, the confinement factor of the fundamental mode remains large, whereas the confinement factor of the second-order mode, next in the descending order of the confinement factor value, is substantially decreased. (b) Near field profile of the fundamental mode (solid curve) and second-order mode (dashed) versus the vertical distance. (c) Far field profile of the fundamental mode with divergence versus the vertical angular coordinate.

FIG. 4 shows a schematic diagram of prior art device [4]: (a) Cross-section view of a semiconductor edge-emitting laser in the vertical and longitudinal directions as in FIG. 1 with thick asymmetric mode expansion layer (11) below the active layer (4) and in the waveguide layer (3). The refractive index of the expansion layer (11) is adjusted to the effective index of the fundamental mode and provides its expansion towards this layer. (b) Near field profile of the fundamental mode with asymmetric expansion (21) towards the layer (11) versus the vertical distance. (c) Far field profile of the fundamental mode with narrow divergence versus the vertical angular coordinate.

FIG. 5 shows a schematic diagram of prior art device [7-8]: (a) Cross-section view of a semiconductor edge-emitting laser in the vertical and longitudinal directions based on the photonic band crystal concept with a photonic band crystal formed by a periodic sequence of pairs of low-index layers (11) and high refractive index layers (12) and with the active layer (4) as a defect of the photonic band crystal, where the fundamental mode peak is localized. The number of the layer pairs chosen for this drawing is for illustration purposes only and much smaller than actual number. (b) Near field profile of the fundamental mode localized at the defect expanding across the photonic band crystal in the part (21) versus the vertical distance. (c) Far field profile of the fundamental mode with narrow divergence versus the vertical angular coordinate.

FIG. 6 shows a schematic diagram of prior art device [9-11]: (a) Cross-section view of a semiconductor edge-emitting laser in the vertical and longitudinal directions with the layer (11) adjusted to match the effective index of the mode localized at the active layer (4) to the refractive index of the layer (11) and the refractive index of the substrate (2), providing mode leakage into the substrate (2). (b) Near field profile of the mode with large leaky component (41) existing in the thick substrate (2) versus the vertical distance. (c) Far field profile of the mode with a weak, broad component (51)

due to the part of the field localized at the active layer and a strong, narrow leaky component (52) versus the vertical angular coordinate.

Figure 7:
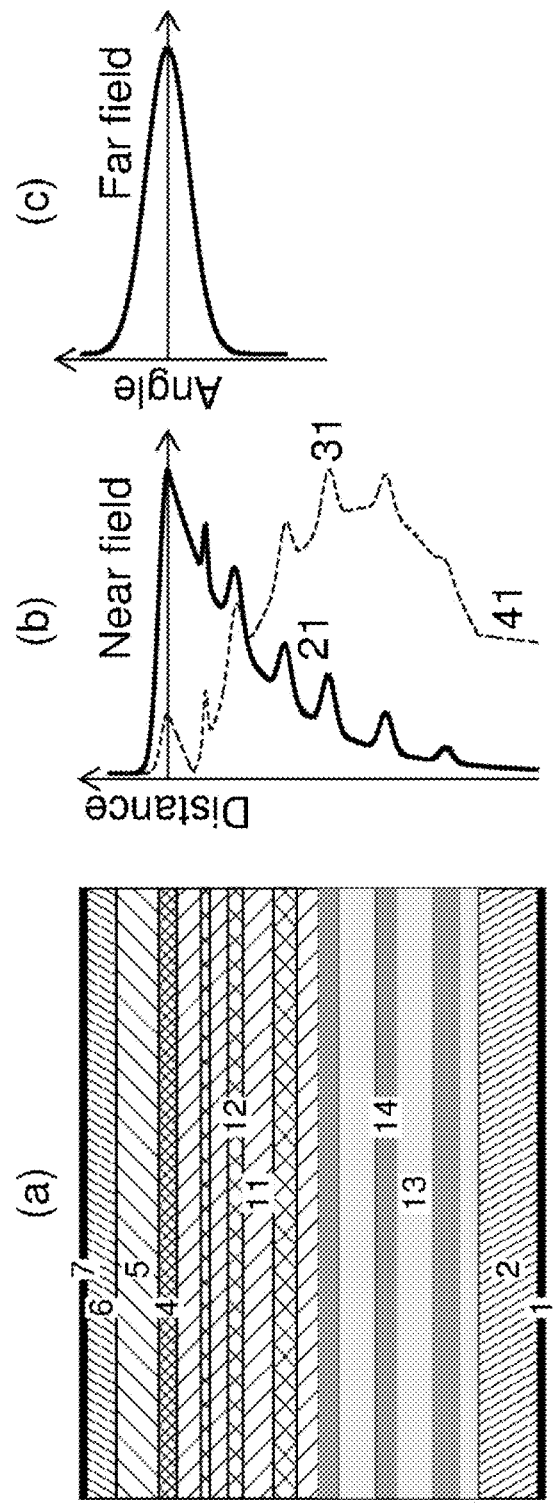

FIG. 7 shows a schematic diagram of one possible embodiment of the present invention: (a) Cross-section view of a broad-area high brightness semiconductor laser where aperiodic sequence of the layers (11) and (12) with alternating refractive indices provides the expansion of the fundamental mode, localized predominantly at the layer with the active region (4), and aperiodic sequence of the layers (13) and (14) with alternating refractive indices provides, firstly, the localization of the higher order modes predominantly at the layer sequences (11) through (14) and, secondly, high loss due to the leakage into the substrate (2). (b) Near field profile of the fundamental mode (solid curve) and higher order mode (dashed) versus the vertical distance. The fundamental mode is localized predominantly at the layer with the active region (4) and expanded across the layer sequences in part (21). The higher order modes are localized predominantly at the layer sequence in part (31) and characterized by large loss due to large leakage component (41) in the substrate (2). (c) Far field profile of the fundamental mode with narrow divergence versus the vertical angular coordinate.

Figure 8:
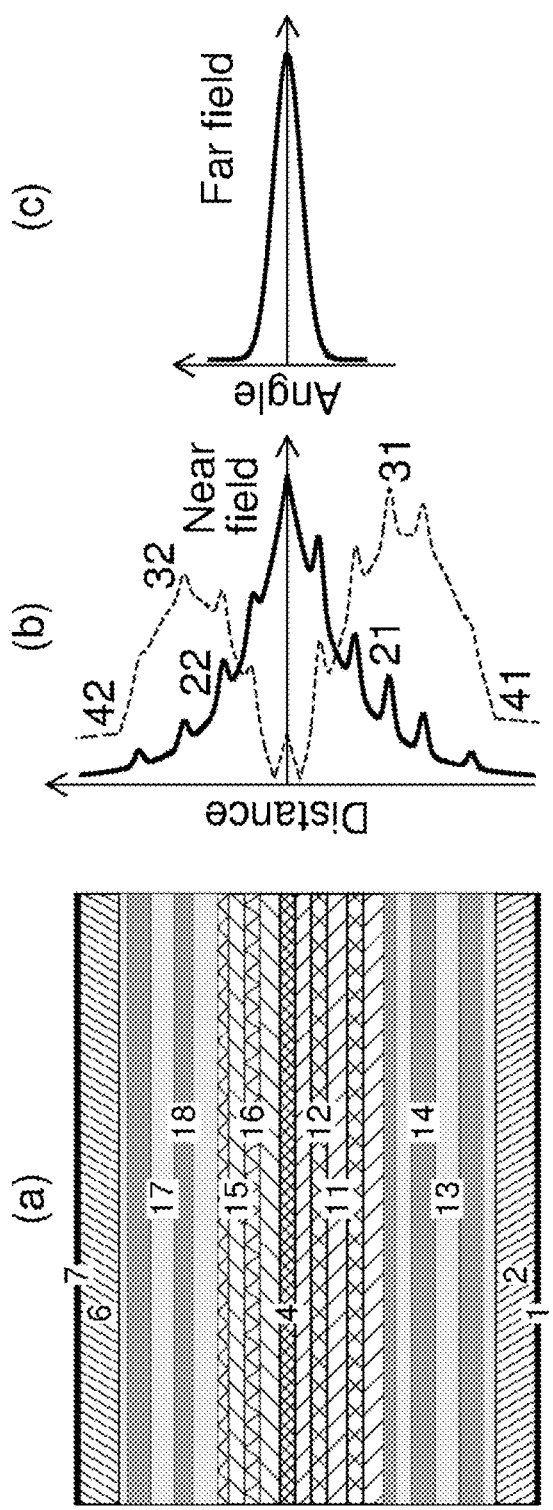

FIG. 8 (a) shows a schematic diagram of one embodiment of the present invention: (a) Cross-section view of a broad-area high brightness semiconductor laser where aperiodic sequences of the layers (11), (12) and (15), (16) with alternating refractive indices at both sides of the layer with the active region (4) provide the expansion of the fundamental mode localized predominantly at the layer with the active region (4), and aperiodic sequences of the layers (13), (14) and (17), (18) with alternating refractive indices at the regions close to the substrate (2) and contact layer (6), respectively, provide, firstly, the localization of the higher order modes predominantly at the layer sequences (11) through (18) and, secondly, high loss due to leakage into the substrate (2) and the contact (6). In this drawing the numbers of the layers chosen and their thicknesses in all sequences are for illustration purpose only. (b) Near field profile of the fundamental mode (solid curve) and higher order mode (dashed) versus the vertical distance. The fundamental mode is located predominantly at the layer with the active region (4) and expanded across the layer sequences in parts (21) and (22). The higher order modes are localized predominantly at the layer sequences (11) through (18) in parts (31) and (32) and characterized by large losses due to large leakage components (41) and (42) into the substrate (2) and the contact layer (6), respectively. (c) Far field profile of the fundamental mode with narrow divergence versus the vertical angular coordinate.

FIG. 9(a) shows refractive index profile for one possible embodiment of the 1060 nm AlGaAs/GaInAs laser waveguide according to the present invention with a substrate (2) of GaAs, a aperiodic leakage controlling sequence of five layer pairs (13) and (14) of $Al_{0.3}Ga_{0.7}As$ and $Al_{0.15}Ga_{0.85}As$, thicknesses 400, 950, 1000, 1030, 1030 nm (from bottom to top) and 150, 90, 70, 50, 30 nm, an aperiodic mode-expansion sequence of five layer pairs (11) and (12) of $Al_{0.35}Ga_{0.65}As$ and $Al_{0.2}Ga_{0.8}As$, thicknesses 1030, 1030, 1020, 1020 nm and 30, 30, 20, 20 nm, a layer (4) of $Al_{0.2}Ga_{0.8}As$ with the active region of GaInAs/GaAsP, a waveguide layer (5) of $Al_{0.5}Ga_{0.5}As$, a contact layer (6) of GaAs. FIG. 9(b) shows a near field profile of the fundamental (solid curve) with an expansion (21) across the whole layer sequences and two higher order (dashed) modes with predominant localization at the layer sequences in pars (31) and large leakage components into the substrate (41). FIG. 9(c) shows a far field profile of the fundamental mode with full width at half maximum of 7.5°.

Figure 9:
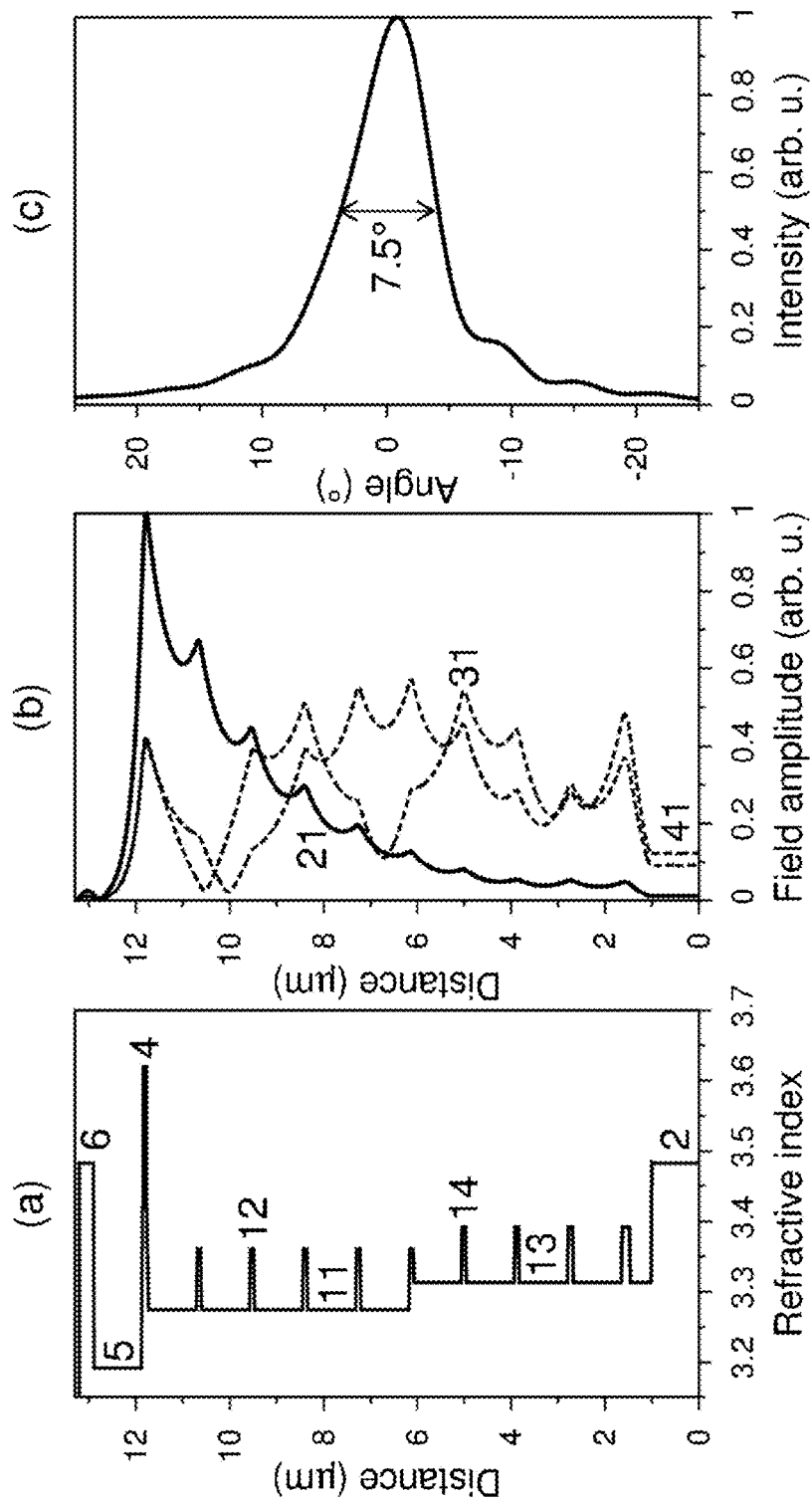
Figure 10:
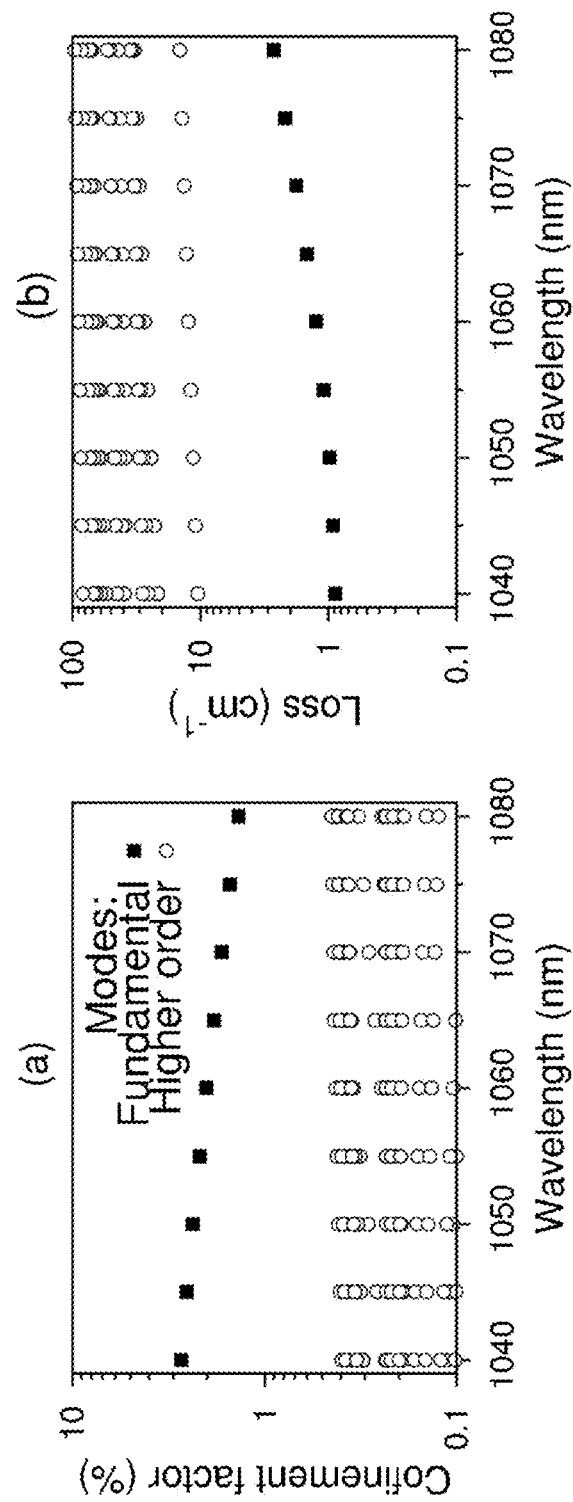

FIG. 10 shows confinement factors (a) and leakage losses (b) of the fundamental (solid squares) and higher order modes (empty circles) versus the wavelength for a laser waveguide for the possible embodiment of the present invention as shown in FIG. 9.

Figure 11:
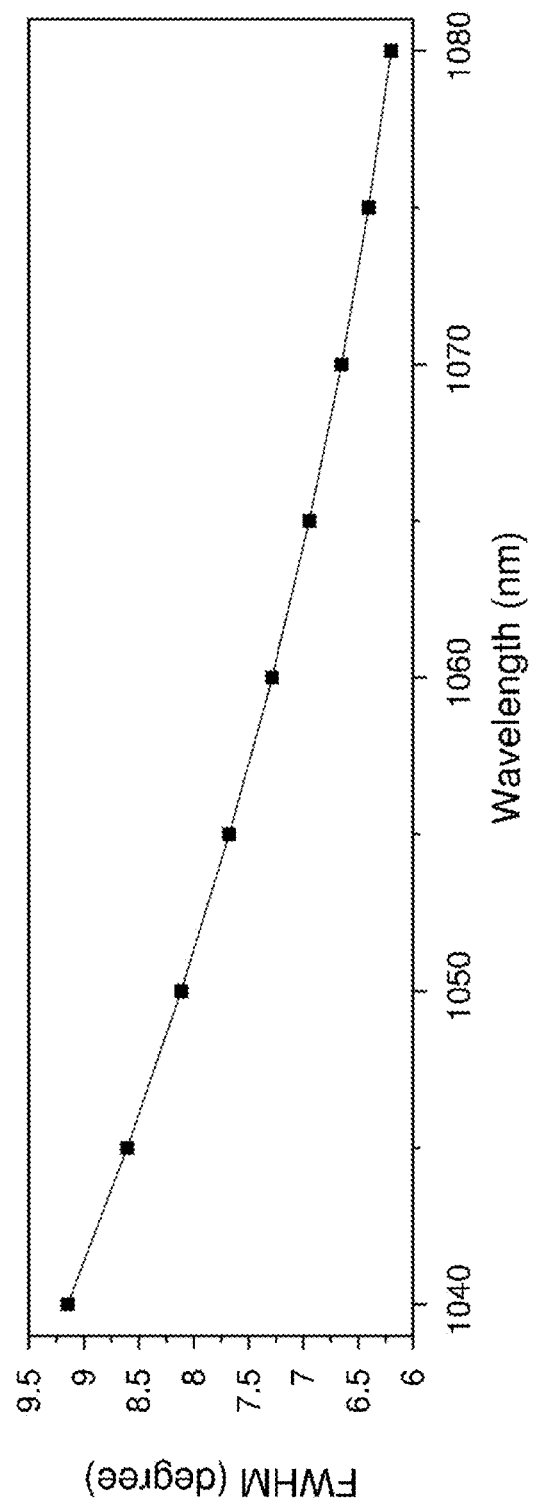

FIG. 11 shows full width at half maximum of the far-field intensity pattern of the fundamental mode versus the wavelength for the laser waveguide for the possible embodiment of the present invention as in FIG. 9.

Figure 12:
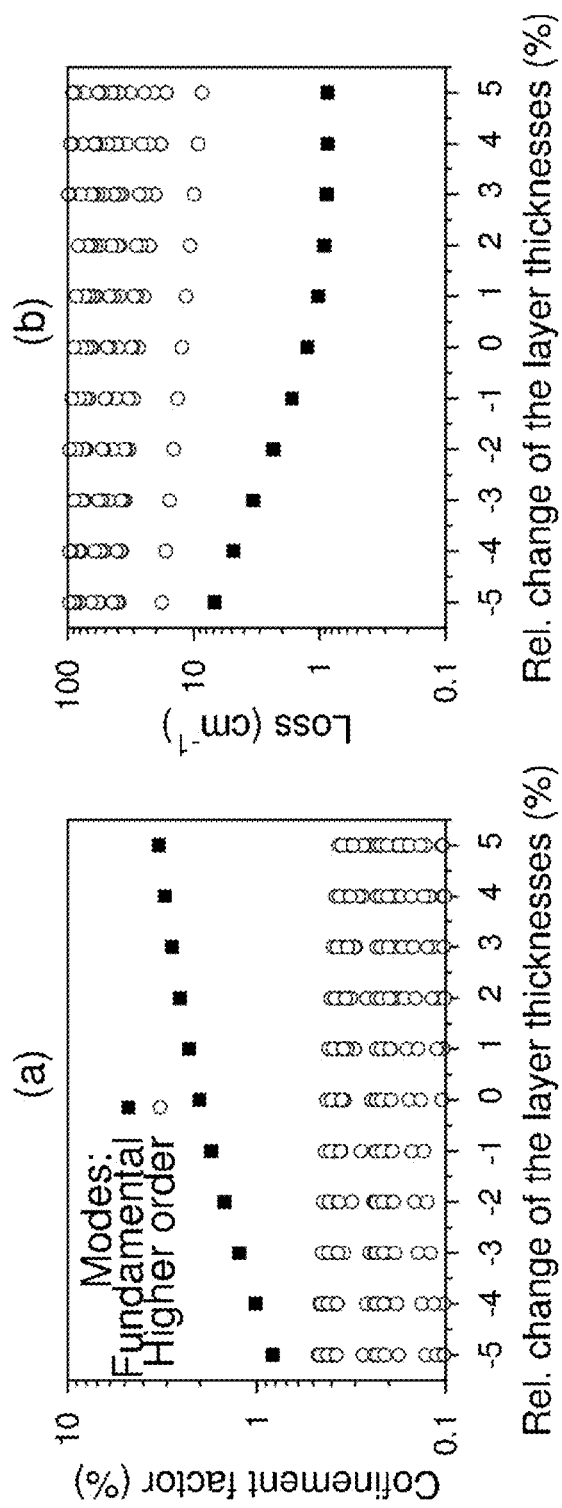

FIG. 12 shows confinement factors (a) and leakage losses (b) of the fundamental (solid squares) and higher order modes (empty circles) versus the relative change of the thicknesses of the layers in the aperiodic sequences of the layers (11) though (14) for the laser waveguide for the possible embodiment of the present invention as in FIG. 9.

DETAILED DESCRIPTION

The following detailed descriptions will present the methods of producing high brightness diode lasers in accordance with preferred embodiments of the present invention, in which the performance features of high brightness edge-emitting lasers providing high beam quality in the vertical direction will be discussed with reference to the accompanying drawings (FIGS. 7-12).

Figure 1:
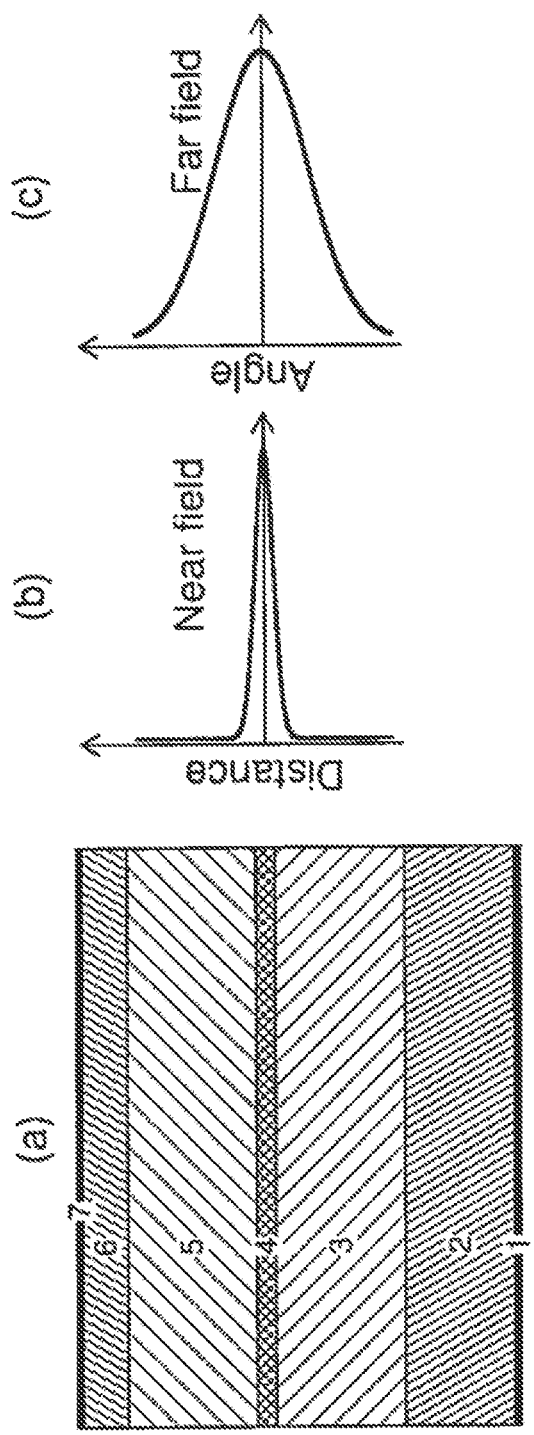
FIG. 1 shows a schematic diagram of prior art device: (a) Cross-section view of a standard semiconductor edge-emitting laser waveguide in the vertical and longitudinal directions (vertical and horizontal directions of the drawing, respectively) consisting of n- and p-type contacts designated (1) and (7), n-doped substrate (2), waveguide layers (3) and (5), waveguide layer (4) containing the active region and p-doped contact layer (6). (b) Near field profile of the fundamental mode versus the vertical distance showing narrow width due to a tight localization at the waveguide layer (4). (c) Far field profile of the fundamental mode showing large divergence as a function of the vertical angular coordinate. This figure as well as FIGS. 2-8 below in parts (a) is not to scale.
Figure 2:
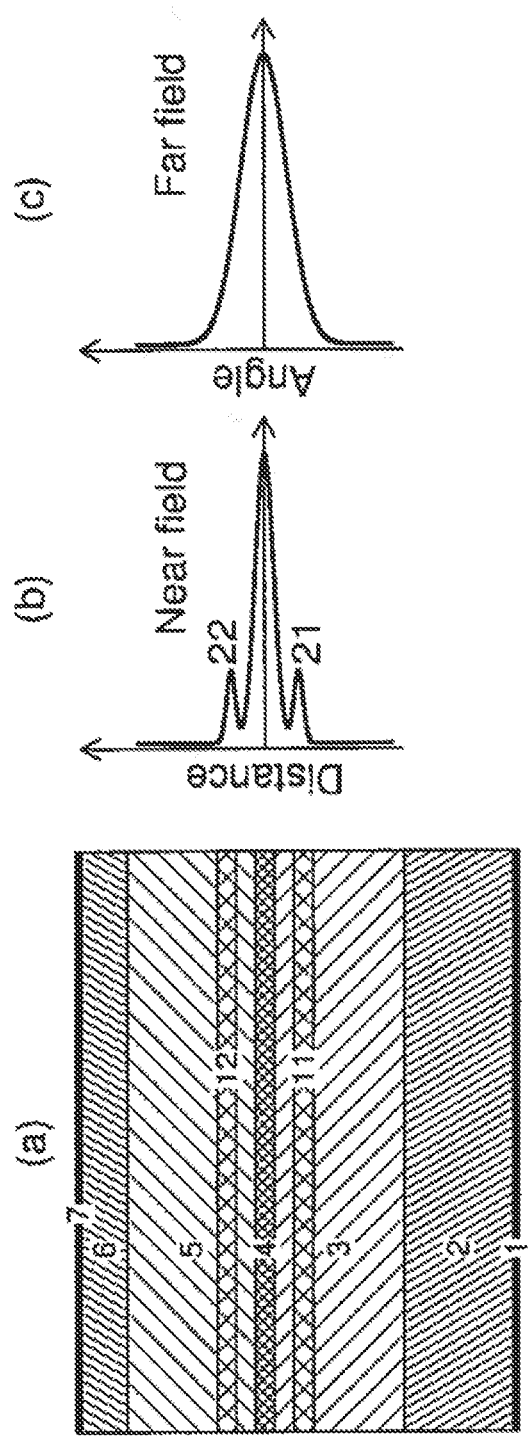
FIGS. 2-6 in parts (b) illustratively present the modifications of the near field, in parts (c) illustratively present the divergence narrowing of the far field of the fundamental mode relative to the case of the edge-emitting laser of FIG. 1.
Figure 3:
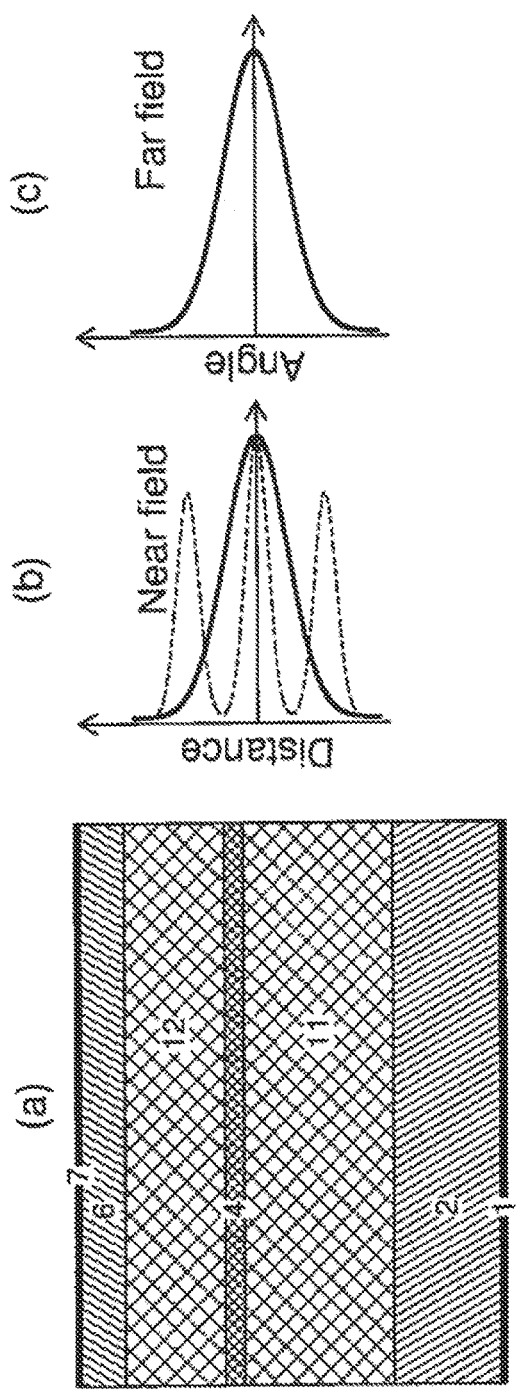
Figure 4:
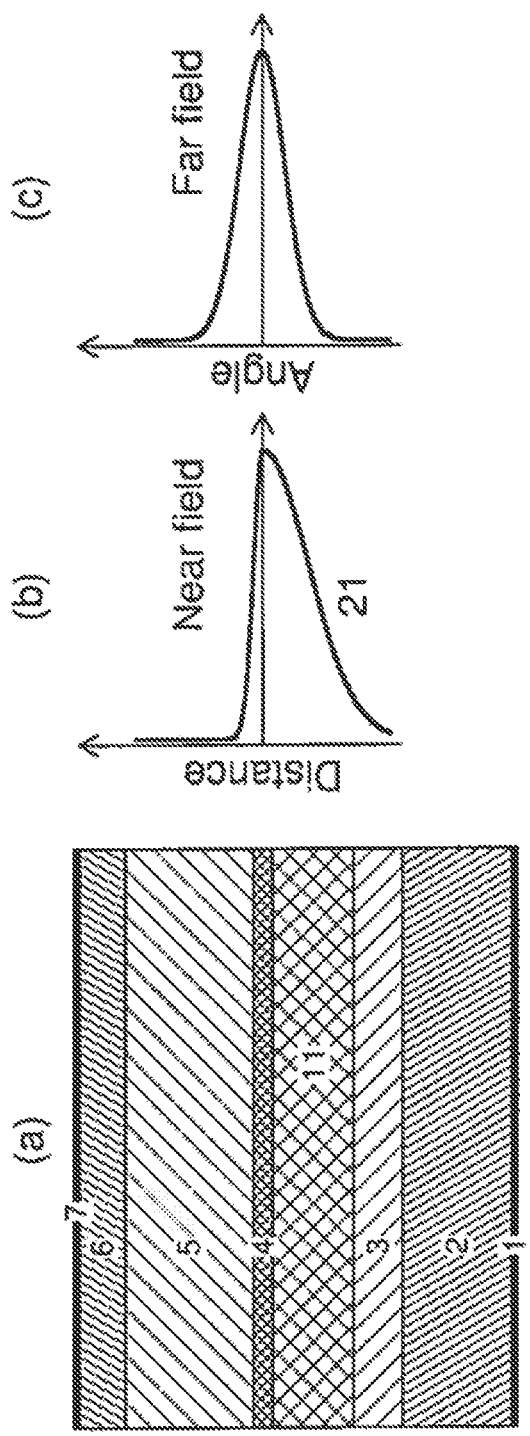
Figure 5:
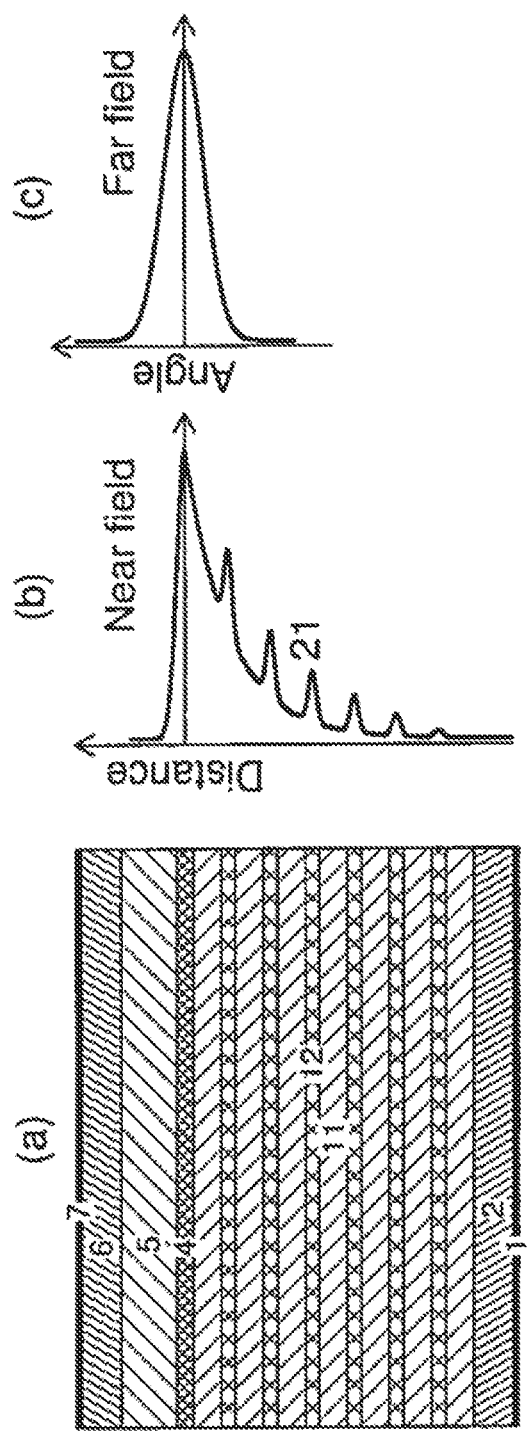
Figure 6:
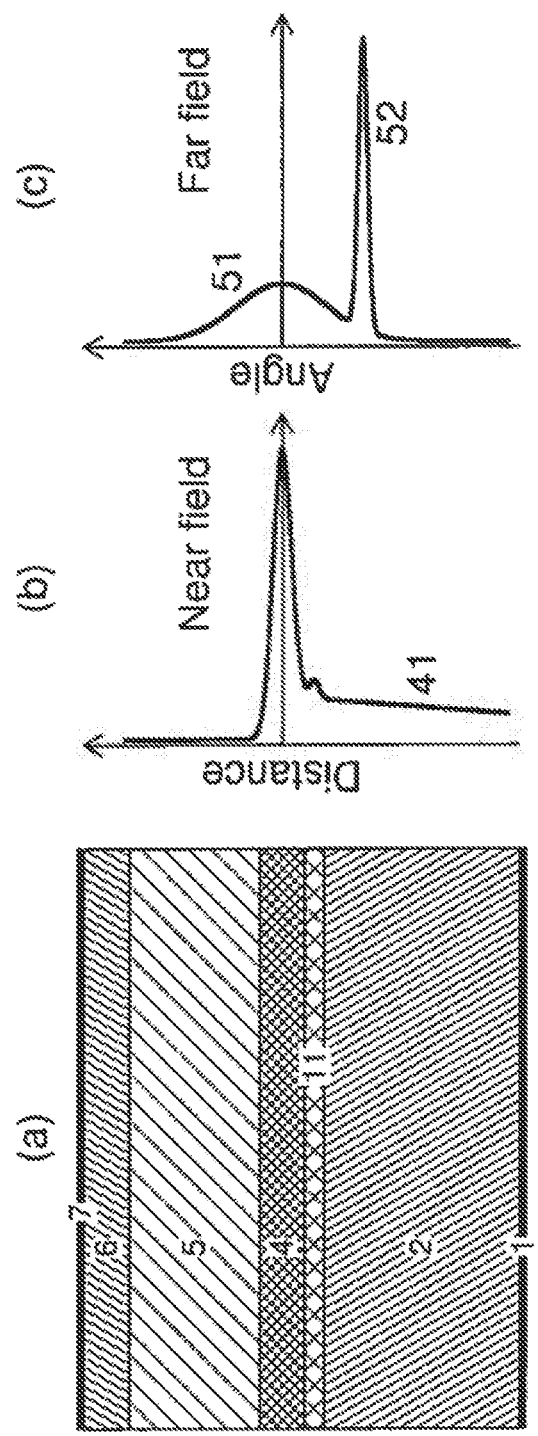

FIG. 1 is a cross-section view of a typical edge-emitting semiconductor laser in the vertical and longitudinal directions with n- and p-type contacts designated (1) and (7), n-doped substrate (2), n-doped waveguide layer (3) and p-doped waveguide layer (5), layer (4) with the active region (included, but not limited to, a single quantum well or multiple quantum wells, quantum wires, quantum dots, or any combinations thereof) and contact layer (6). Layers with these functionalities are present in all embodiments considered below. By current injection the quantum wells (wires, dots) in the active layer (4) provide the optical gain and the generated light propagates along the epitaxial layers. The refractive index of the layer with the active region (4) is larger than the refractive index of the top and bottom waveguide layers (3) and (5); refractive indices of the substrate (2) and contact layer (6) are larger than refractive indices of the waveguide layers (3) and (5). The diode is thus formed by a multi-layered heterostructure consisting of III-V or II-VI semiconductor materials, like (AlGa)As/GaAs, (InGa)As/GaAs, (InGa)(AsP)/GaAs, (ZnMg)(S Se)/Zn(S Se), (Al,Ga,In)N.

Wave guiding in the lateral direction by multi-layered semiconductor waveguides as well as light amplification, laser output at the facets of the waveguides, active region current pumping, current flow through the layers doped by corresponding donors and acceptors, temperature effects and heat removal are performed in a well understood manner and their detailed description is not necessary for an understanding of the present invention (see, e.g. [13]). In particular, the spatial spectrum of the laser output in both vertical and lateral directions is presented as a combination of the vertical and lateral modes guided by the multi-layered heterostructures with contributions from each mode defined by the confinement factors and losses of the laser waveguide modes, and also by the optical gain exceeding the threshold gain.

For high brightness lasers both high power output and narrow divergence are required. For the vertical direction several methods to achieve narrow output beam were disclosed [2-12], which are described in the section "Background and state of the art" and illustrated in FIGS. 2-6.

Widening of the laser waveguide to increase the mode width and decrease the output beam divergence inevitably causes the worsening of the beam quality, since the waveguide becomes multi-mode. Suppression of higher order modes in favor of the fundamental mode with a single-lobe far field is needed. In the present invention which is focusing on wide waveguide lasers, the high brightness is achieved by utilizing wide-area heterostructures, consisting of specific aperiodic sequences of multiple epitaxial layers with alternating refractive indices (FIGS. 7-12). These sequences of the layers provide the expansion of the fundamental mode across the whole sequence, larger confinement factor and smaller leakage loss of the fundamental mode as compared to those of the higher order modes. By this way the output radiation becomes single-mode and has a single-lobe far field with narrow divergence in the vertical direction. That makes it possible to obtain a high brightness output due to the higher power of the broad-area laser waveguide feasible before the onset of thermal and current spreading, catastrophic optical mirror damage and other limiting nonlinear optical effects.

Discrimination between the vertical modes for the waveguide embodiments accordingly to the present invention (FIGS. 7-12) is proven based on the solution of the eigenvalue wave equation [13]. For the electric field $E(x,z,t)=E(x)\exp(i\beta z-i\omega t)$ of TE modes propagating along the multi-layered structures with the distribution of the refractive index $n(x)$, this equation reads as follows:

$$[d^2/dx^2+k^2n^2(x)]E(x)=\beta^2 E(x), \quad (1)$$

where $\beta$ is the propagation constant, $k=\omega/c$ is the wavenumber, $\omega$ is the frequency, $x$ and $z$ are the vertical and the longitudinal coordinates along the directions perpendicular and parallel to the layer planes, respectively, $t$ is the time coordinate. Boundary conditions corresponding to non-reflecting conditions at the top and bottom of the considered computational domain are used and the solutions of Eq. (1) represent the multitude of the eigen-modes of the waveguides guided owing to the diffraction at the epitaxial layers. The complex eigenvalue $\beta=\beta'+\beta''$ defines the characteristics of the modes, such as the effective index $n_{eff}=\beta'/k$ and the losses $\alpha=2\beta''$. The latter are defined by the field leakage into the high refractive index substrate and contact layers, as well as by the presence of internal losses in the layers due to the material absorption in the layers and absorption by free carriers in the doped layers of the laser waveguide:

$$\alpha=\alpha_{leakage}+\alpha_{internal} \quad (2)$$

Furthermore, the electric field profiles $E(x)$ allows calculation of the confinement factors of the modes $\Gamma$, which are defined as the portion of the mode power overlapping with the active region of the laser waveguide.

Typically edge-emitting semiconductor lasers are considered as multi-layered waveguide structure of finite longitudinal length with the modes $E(x)\exp(\pm i\beta z)$ propagating forth and back between the facets of the structure. As it is followed from well-known laser threshold condition [13], each mode is considered to laser and contribute to the output of the laser when the optical gain g of the laser exceeds the threshold gain for this mode:

$$g>g_{threshold}=(\alpha_{leakage}+\alpha_{internal}+\alpha_{external})/\Gamma, \quad (3)$$

where $\alpha_{external}$ are the mode external losses due to the laser radiation through the facets. When the reflectivities of the mode at the facets are $R_1$ and $R_2$, then $\alpha_{external}=(\frac{1}{2}L)\ln(1/R_1R_2)$, where L is the laser length. The facets are typically coated by special films, leading to high reflection and low reflection at the rear and output facets with $R_1\approx 1$ and $R_2\ll 1$, respectively, and thus the lasers emit predominantly through the output facet.

The present invention is based on the realization that for high power single-mode lasing of the semiconductor lasers at high pump current levels the threshold gain of the fundamental mode should be much lower than the threshold gain of all higher order modes. This condition is fulfilled by increasing the leakage and internal losses and decreasing the confinement factors of the higher order modes. Both these control actions lead to an increase of the threshold of the higher order modes, as follows from Eq. (3). Then at high exceeding of the gain above the threshold, leading to the high output power, the spatial content of the laser radiation will consist of the fundamental mode only with a single lobe in the far field. When both actions are accompanied also by expansion of the fundamental mode in the near field with small divergence in the far field, the edge-emitting semiconductor lasers show high brightness output.

Specific aperiodic sequences of the layers located between high refractive index substrate and contact layers provide wide possibilities to control the localization, leakage and absorption of the modes.

First, varying the thickness and refractive index of the layer with the active region and at the same time thicknesses and alternating refractive indices of the layer sequence close to this layer one can obtain a fundamental mode localization with large confinement factor and broad extension of the field to the sequence. Physical effect responsible for mode expansion is the retraction of the field into high refractive index layers causing local maxima in the fields of the modes as functions of the vertical distance. A qualitative measure to achieve this objective is the proximity of the mode effective index to the mean refractive index of the sequence. The mode expansion sequence can be located below the layer with the active region. There can be also two mode expansion sequences above and below this layer.

Second, by specifically varying the thicknesses and alternating the refractive indices of the aperiodic layer sequences away from the active layer, localization of the higher order mode maxima away from the layer with the active layer, close to the substrate and/or to the contact layer can be achieved. This leads to a large leakage component into the substrate and/or contact layers. A qualitative measure to achieve this second objective is a shift of the 'center of gravity' of the refractive index profile towards the substrate and/or contact layer. The fundamental mode has a small field value in this leakage-controlling sequence and is not noticeably influenced by it. Hence, these two steps to achieve expanded fundamental mode with large confinement and small leakage and higher order modes with small confinement and large leakage do not conflict with each other and could be performed simultaneously.

FIG. 7 is a graphical representation of a broad-area high brightness AlGaAs/GaInAs semiconductor laser at 1060 nm with one possible embodiment of the present invention where aperiodic sequence of the layers (11) and (12) with alternating refractive indices provides the expansion of the fundamental mode localized predominantly at the layer with the active region (4), and aperiodic sequence of the layers (13) and (14) with alternating refractive indices provides, firstly, the localization of the higher order modes predominantly at the layer sequences (11) through (14) and, secondly, high loss due to the leakage into the substrate (2). In this embodiment of the laser on a GaAs substrate, the preferable material for the waveguide layers is $Al_xGa_{1-x}As$ with different Al content x. For the embodiment of FIG. 7 the content x alternates between 0.35 and 0.20 in the layers (11)-(12) and between 0.30 and 0.15 in the layers (13)-(14) and equals to 0.5 in the contact layer (5). The numbers of the layers (11)-(12) and (13)-(14) are equal to 7 and 6, thicknesses are 650, 150, 600, 200, 700, 370, 550 nm and 500, 780, 525, 840, 550, 390 nm (from top to bottom), respectively. The layer (4) of $Al_{0.2}Ga_{0.8}As$ contains the active region of, but not limited to, GaInAs quantum well with GaAsP quantum barriers of the total thickness 150 nm. Material content, thicknesses and number of the layers in the sequence are not limited to those chosen in the embodiment of FIG. 7. Mode-expansion sequence (11)-(12) and leakage-controlling sequence (13)-(14) are located in, but not limited to, between the active layer and the substrate. The fundamental mode has broadened near field profile (solid curve) in part (21) owing to the retraction of the mode field into high index layers (12) for the appropriate refractive index profile of the layers (11), (12) and for a given layer with the active region (4). The higher order modes, like first-order mode shown by the dashed curve, are characterized by the predominant localization at the layer sequence in part (31) and by large loss due to large leakage component (41) in the substrate (FIG. 7 (b)).

Far field profile of the fundamental mode calculated by the Fourier transformation with inclination term [13] is shown versus the vertical angular coordinate in FIG. 7 (c) and characterized by the narrow divergence of 10° (full width at half maximum) owing to the broad-area near field of the mode.

FIG. 8 is a graphical representation of a broad-area high brightness AlGaAs/GaInAs semiconductor laser with another possible embodiment of the present invention where aperiodic sequences of the epitaxial layers to expand the fundamental mode and discriminate the higher order modes are formed symmetrically or non-symmetrically at both sides in respect to the layer with the active region. In this embodiment aperiodic sequences of the layers (11), (12) and (13), (14) with alternating refractive indices at both sides of the layer with the active layer (4) provide the expansion of the fundamental mode localized predominantly at the layer with active region (4), and aperiodic sequences of the layers (15), (16) and (17), (18) with alternating refractive indices at the regions close to the substrate (2) and contact layer (6) provide, firstly, the localization of the higher order modes predominantly at the layer sequences (11) through (18) and, secondly, high loss due to the leakage into the substrate (2) and the contact (6). For the embodiment of FIG. 8 the content x alternates between 0.35 and 0.20 in the layers (11)-(12), (15)-(16) and between 0.30 and 0.15 in the layers (13)-(14), (17)-(18). The numbers of the layers (11)-(14) and (15)-(18) are equal to 11 and 9, thicknesses are 520, 420, 550, 400, 540, 300, 300, 650, 650, 750, 200 nm (from the active layer to substrate) and 400, 200, 350, 150, 300, 250, 350, 250, 100 nm (from active layer to contact layer), respectively. The layer (4) of $Al_{0.2}Ga_{0.8}As$ contains the active region of, but not limited to, GaInAs quantum well with GaAsP quantum barriers of the total thickness 100 nm. Material content, thicknesses and number of the layers in the sequence are not limited to those chosen in the embodiment of FIG. 7. Mode-expansion sequences (11), (12) and (13), (14) and leakage-controlling sequences (15), (16) and (17), (18) are located symmetrically or non-symmetrically between the active layer and the substrate and between the active layer and the contact layer. The fundamental mode is expanded over the layer sequences in parts (21) and (22). The higher order modes are localized predominantly at the layer sequences in parts (31) and (32) and characterized by large losses due to large leakage components (41) and (42) into the substrate (2) and the contact layer (6). The far field profile of the fundamental mode is characterized by the narrow divergence owing to the broad-area near field of the mode (FIG. 8 (c)).

FIG. 9 (a) shows the refractive index profile for a 1060 nm laser waveguide with another possible embodiment of the present invention. The waveguide consists of, but not limited to, a substrate (2) of GaAs, a aperiodic leakage controlling sequence of five layer pairs (13) and (14) of $Al_{0.3}Ga_{0.7}As$ and $Al_{0.15}Ga_{0.85}As$, thicknesses 400, 950, 1000, 1030, 1030 nm (from bottom to top) and 150, 90, 70, 50, 30 nm, a aperiodic mode-expansion sequence of five layer pairs (11) and (12) of $Al_{0.35}Ga_{0.65}As$ and $Al_{0.2}Ga_{0.8}As$, thicknesses 1030, 1030, 1020, 1020 nm and 30, 30, 20, 20 nm, a layer (4) of $Al_{0.2}Ga_{0.8}As$ with the active region of GaInAs/GaAsP, a waveguide layer (5) of $Al_{0.5}Ga_{0.5}As$, and a contact layer (6) of GaAs. Near field profiles of the modes for this embodiment obtained by solution of Eq. (1) are shown in FIG. 9 (b). The fundamental mode (solid curve) is expanded across the whole layer sequences in part (21) and two higher order modes (dashed curves) with predominant localization at the layer sequences in parts (31) have large leakage components into the substrate (41). Due to mode expansion across the whole thick layer sequences (11) through (14) the far field profile of the fundamental mode has extremely low full width at half maximum of 7.5° (FIG. 9 (c)).

FIG. 10 shows the leakage losses and the confinement factors of the fundamental (filled squares) and high order modes (empty circles) versus the wavelength for a high brightness broad-area edge-emitting laser at 1060 nm for a possible embodiment of the waveguide as in FIG. 9. The insensitivity in respect variations of the wavelength around 1060 nm in wide range is clearly visible. In the whole wavelength range the confinement factor is one order of magnitude larger and the leakage losses of the fundamental mode are one order of magnitude smaller than those of the multiple higher order modes of the waveguide. Thus, effective mode discrimination in favor of the fundamental mode occurs in a wide wavelength range.

FIG. 11 shows the full width at half maximum of the far-field intensity pattern of the fundamental mode versus the wavelength for a possible embodiment of the waveguide as in FIG. 9. For a wide wavelength range the divergence is less than 9°.

Results of FIGS. 10 and 11 guarantee that this possible embodiment of the broad-area laser waveguide has a stable narrow divergence and high power, i.e. high brightness, of the output radiation for large exceeding of the pump current over the threshold and varying operational conditions, like temperature, capable to change the lasing wavelength in the semiconductor edge-emitting lasers.

FIG. 12 shows the leakage losses and the confinement factors of the fundamental (filled squares) and higher order modes (empty circles) versus the relative change of the thickness of the layers for specific aperiodic sequences of the layers (11) though (14) for the possible embodiment of the waveguide as in FIGS. 9-11. For arbitrary changes of the layer thicknesses in both the mode-expansion and the leakage-controlling sequences within reasonable limits ±5%, the modes of the waveguide remain discriminated. This figure thus illustrates the insensitivity to tolerance variations of the layer thicknesses at the growth of the epitaxial layers.

Similarly, insensitivity to the tolerance variations of the layer composition also occurs for a possible embodiment of the waveguide as in FIG. 8.

In another embodiment of the present invention specific aperiodic sequences of the epitaxial layers to expand the fundamental mode and discriminate the higher order modes are formed below the layer with the active layer or symmetrically or non-symmetrically at both sides in respect to the layer with the active region and accompanied by non-uniform free carrier doping profiles in the sequences. These doping profiles provide additional increase of the internal losses of the higher order modes due to free-carrier absorption as compared to the internal losses of the fundamental mode according to Eq. (3). The maximum of the fundamental mode is located at the active layer, whereas the maxima of the higher order modes are located in the region close to the substrate and/or to the contact layer in the case when the modes are expanded towards both the directions with respect to the active layer. When the areas adjacent to the substrate and/or to the contact layer are doped heavier than the lightly doped or undoped region in and around the active layer, the difference in the total losses between the fundamental mode and the high order modes becomes more pronounced.

Since the power density per facet area is decreased upon broadening the waveguide and expanding the fundamental mode, larger output power is obtained before the onset of thermal and current spreading, catastrophic optical mirror damage and other nonlinear optical effects.

The invention is applicable to different laser diode systems based on (Al, Ga, In, P)(As, P, Sb), (Al, Ga, In)N and II-VI semiconductor heterostructures for the infra-red, red, visible and UV wavelength ranges.

In summary, the most preferred embodiments of the invention have the following features:

A first preferred embodiment of the invention relates to a device comprising an edge-emitting semiconductor laser, said laser having a multi-layered waveguide, said waveguide comprising at least one layer with the active region that emits light under electrical injection, at least one layer doped with p-type impurity at one side of the layer with the active region and multiple layers doped with n-type impurity, stacked between the substrate and the layer with the active region in the direction perpendicular to the light propagation forming an aperiodic sequence, wherein said waveguide has the fundamental mode localized at the layer containing the active region and expanded to the whole area of said multi-layered sequence, wherein said waveguide has all higher order modes localized at said multi-layered sequence with leakage losses into the substrate larger than that of the fundamental mode, wherein said waveguide provides a single-mode output radiation with small divergence.

Said multi-layered sequence preferably has non-uniform doping by n-type impurity with increased concentration in the layers of localization of the higher order modes contiguous to the substrate with larger leakage and total internal losses of the higher order modes as compared to that of the fundamental mode.

Said edge-emitting semiconductor laser preferably comprises heterostructures having III-V or II-VI semiconductor materials. Said heterostructures preferably comprise one or multiple layers of quantum wells, quantum wires, or quantum dots as active region.

A second preferred embodiment of the invention relates to a device comprising an edge-emitting semiconductor laser, said laser having a multi-layered waveguide, said waveguide comprising at least one layer with the active region that emits light under electrical injection, at least one layer doped with n-type impurity at one side of the layer with the active region and multiple layers doped with p-type impurity, stacked between the contact layer and the layer with the active region in the direction perpendicular to the light propagation forming an aperiodic sequence, wherein said waveguide has the fundamental mode localized at the layer containing the active region and expanded to the whole area of said multi-layered sequence, wherein said waveguide has all higher order modes localized at said multi-layered sequence with leakage losses into the contact layer larger than that of the fundamental mode, wherein said waveguide provides a single-mode output radiation with small divergence.

Said multi-layered sequence preferably has non-uniform doping by p-type impurity with increased concentration in the layers of localization of the higher order modes contiguous to the contact layer with larger leakage and total internal losses of the higher order modes as compared to that of the fundamental mode.

Said edge-emitting semiconductor laser preferably comprises heterostructures having III-V or II-VI semiconductor materials. Said heterostructures preferably comprise one or multiple layers of quantum wells, quantum wires, or quantum dots as active region.

A third preferred embodiment of the invention relates to a device comprising an edge-emitting semiconductor laser, said laser having a multi-layered waveguide, said waveguide comprising at least one layer with the active region that emits light under electrical injection and multiple layers doped with n-type impurity and multiple layers doped with p-type impurity, stacked symmetrically or non-symmetrically below and above the layer with the active region till the substrate and till the contact layer, respectively, in the direction perpendicular to the light propagation forming aperiodic sequences, wherein said waveguide has the fundamental mode localized at the layer containing the active region and expanded to the whole areas of said multi-layered sequences, wherein said waveguide has all higher order modes localized at said multi-layered sequences with leakage losses into the contact layer and into the substrate larger than that of the fundamental mode, wherein said waveguide provides a single-mode output radiation with small divergence.

Said sequences below and above the layer with the active region preferably have non-uniform doping by n-type impurity with increased concentration in the areas of the predominant localization of the higher order modes contiguous to the substrate and by p-type impurity with increased concentration in the areas of the predominant localization of higher order modes contiguous to the contact layer, respectively, with larger leakage and total internal loss of the higher order modes than that of the fundamental mode.

Said edge-emitting semiconductor laser preferably comprises heterostructures having III-V or II-VI semiconductor material. Said heterostructures preferably comprise one or multiple layers of quantum wells, quantum wires, or quantum dots as active region.

A fourth preferred embodiment of the invention relates to a device comprising an edge-emitting semiconductor laser, said laser having a multi-layered waveguide, and said waveguide comprising at least one layer with an active region that emits light under electrical injection, and at least one aperiodic layer stack.

Various embodiments (a), (b), and (c) of the aperiodic layer stack (mentioned above) are described below.

a) Aperiodic layer stack with aperiodic leakage controlling sequence:

Said layer stack preferably comprises an aperiodic leakage controlling sequence configured to cause leakage losses for higher order modes of the emitted light. Said aperiodic leakage controlling sequence preferably comprises layers of alternating refractive indices, said layers having either a first refractive index or a second refractive index, the first refractive index being larger than the second refractive index. The thickness of the layers that have the first refractive index, preferably decreases inside said aperiodic leakage controlling sequence towards the active region, whereas the thickness of the layers that have the second refractive index, preferably increases towards the active region.

b) Aperiodic layer stack with aperiodic mode expansion sequence:

Instead of an aperiodic leakage controlling sequence, said layer stack may comprise an aperiodic mode expansion sequence configured to expand the fundamental mode of the emitted light. Said aperiodic mode expansion sequence preferably comprises layers of alternating refractive indices, said layers having either a first refractive index or a second refractive index, the first refractive index being larger than the second refractive index. The thickness of the layers of said aperiodic mode expansion sequence preferably decreases towards the active region.

c) Aperiodic layer stack with both, an aperiodic mode expansion sequence and an aperiodic leakage controlling sequence:

According to this embodiment, the layer stack comprises:
- an aperiodic leakage controlling sequence configured to cause leakage losses for higher order modes of the emitted light, and
- an aperiodic mode expansion sequence configured to expand the fundamental mode of the emitted light.

Said aperiodic leakage controlling sequence preferably comprises layers of alternating refractive indices, said layers having either a first refractive index or a second refractive index, the first refractive index being larger than the second refractive index. Said aperiodic mode expansion sequence preferably comprises layers of alternating refractive indices, said layers having either a third refractive index or a fourth refractive index, the third refractive index being larger than the fourth refractive index. The aperiodic mode expansion sequence is preferably located between the active region and the aperiodic leakage controlling sequence.

The fourth refractive index is preferably smaller than the second refractive index.

The second refractive index is preferably smaller than the third refractive index.

The third refractive index is preferably smaller than the first refractive index.

The thickness of the layers that have the first, third and fourth refractive index, preferably decreases towards the active region, whereas the thickness of the layers that have the second refractive index, preferably increases towards the active region.

REFERENCE SIGNS (1) n-type contact
(2) substrate
(3) waveguide layer
(4) layer with the active region
(5) waveguide layer
(6) contact layer
(7) p-type contact
(11) mode expanding layers
(12) mode expanding layers
(13) leakage enhancing layers
(14) leakage enhancing layers
(15) mode expanding layers
(16) mode expanding layers
(17) leakage enhancing layers
(18) leakage enhancing layers
(21) expanded parts of the fundamental mode profile
(22) expanded parts of the fundamental mode profile
(31) expanded parts of the higher order mode profile
(32) expanded parts of the higher order mode profile
(41) leakage component of the mode profile
(42) leakage component of the mode profile
(51) broad weak part of the mode far field profile
(52) narrow strong part of the mode far field profile

REFERENCES CITED

1. W. Schulz and R. Poprawe, "Manufacturing with novel high-power diode lasers", IEEE J. Sel. Top. Quantum Electron. Vol. 6, No. 4, pp. 696-705 (2000).
2. P. M. Smowton, G. M. Lewis, M. Yin, H. D. Summers, G. Berry, and C. C. Button, "650-nm lasers with narrow far-field divergence with integrated optical mode expansion layers", IEEE J. Sel. Top. Quantum Electron. Vol. 5, No. 3, pp. 735-739 (1999).
3. N. A. Pikhtin, S. O. Slipchenko, Z. N. Sokolova, A. L. Stankevich, D. A. Vinokurov, I. S. Tarasov, Zh. I. Alferov, "16 W continuous-wave output power from 100 µm-aperture laser with quantum well asymmetric heterostructure", Electron. Lett. Vol. 40. no. 22, pp. 1413-1414 (2004).
4. A. P. Bogatov, T. I. Gushchik, A. E. Drakin, A. P. Nekrasov and V. V. Popovichev, "Optimization of waveguide parameters of laser InGaAs/AlGaAs/GaAs heterostructures for obtaining the maximum beam width in the resonator and the maximum output power", Quantum Electron. Vol. 38, No. 10, pp. 935-939 (2008).
5. A. Al-Muhanna, L. J. Mawst, and D. Botez, D. Z. Garbuzov, R. U. Martinelli, and J. C. Connolly, "High-power (>10 W) continuous-wave operation from 100-mm-aperture 0.97-mm-emitting Al-free diode lasers", Appl. Phys. Lett. Vol. 73, No. 9, pp. 1182-1184 (1998).
6. P. Crump, A. Pietrzak, F. Bugge, H. Wenzel, G. Erbert, and G. Tränkle, "975 nm high power diode lasers with high efficiency and narrow vertical far field enabled by low index quantum barriers", Appl. Phys. Lett. Vol. 96, No. 131110 (2010).
7. N. N. Ledentsov and V. A. Shchukin, "Novel concepts for injection lasers", Opt. Eng. Vol. 41, No. 12, pp. 3193-3203 (2002).
8. M. V. Maximov, Y. M. Shernyakov, I. I. Novikov, S. M. Kuznetsov, L. Y. Karachinsky, N. Y. Gordeev, V. P. Kalosha, V. A. Shchukin, and N. N. Ledentsov, "High performance 640 nm-range GaInP/AlGaInP lasers based on the longitudinal photonic bandgap crystal with narrow vertical beam divergence," IEEE J. Quantum Electron. Vol. 41, No. 11, pp. 1341-1348 (2005).
9. K. Posilovic, T. Kettler, V. A. Shchukin, N. N. Ledentsov, U. W. Pohl, D. Bimberg, J. Fricke, A. Ginolas, G. Erbert, G. Trankle, J. Jonsson, and M. Weyers, "Ultrahigh-brightness 850 nm GaAs/AlGaAs photonic crystal laser diodes," Appl. Phys. Lett. Vol. 93, No. 221102 (2008).

10. W. Streifer, R. D. Burnham, and D. R. Scifres, "Substrate radiation losses in GaAs heterostructure lasers," IEEE J. Quantum Electron. Vol. 12, No. 3, pp. 177-182 (1976).
11. R. Scifres, W. Streifer, and R. D. Burnham, "Leaky wave room-temperature double heterostructure GaAs/GaAlAs diode laser," Appl. Phys. Lett. Vol. 29, No. 1, pp. 23-25 (1976).
12. V. Shchukin, N. Ledentsov, K. Posilovic, V. Kalosha, T. Kettler, D. Seidlitz, M. Winterfeldt, D. Bimberg, N. Y. Gordeev, L. Y. Karachinsky, I. I. Novikov, Y. M. Shernyakov, A. V. Chunareva, M. V. Maximov, F. Bugge, and M. Weyers, "Tilted Wave Lasers: A Way to High Brightness Sources of Light", IEEE J. Quantum Electron. Vol. 47, No. 7, pp. 1014-1027 (2011).
13. H. C. Casey and M. B. Panish, Semiconductor lasers. New York: Academic Press (1978).

What is claimed is:

1. A device comprising an edge-emitting semiconductor laser,
    the laser having a multi-layered waveguide, the waveguide comprising at least one layer with an active region that emits light under electrical injection, at least one layer doped with p-type impurity at one side of the layer with the active region and multiple layers doped with n-type impurity, stacked between a substrate and the layer with the active region in a direction perpendicular to the light propagation forming an aperiodic multi-layered sequence, wherein
    the waveguide
        has the fundamental mode localized at the layer containing the active region and expanded to a whole area of the multi-layered sequence,
        has higher order modes localized at the multi-layered sequence with leakage losses into the substrate larger than that of the fundamental mode, and
        provides a single-mode output radiation with small divergence, and
    the aperiodic multi-layered sequence includes
        an aperiodic mode expansion sequence comprising a plurality of layer pairs, each layer pair having two layers of alternating refractive indices providing the expansion of the fundamental mode localized predominantly at the layer with the active region, the layers having a first refractive index and a second refractive index, the first refractive index being larger than the second refractive index, and
        an aperiodic leakage controlling sequence comprising a plurality of layer pairs, each layer pair having two layers of alternating refractive indices providing the localization of the higher order modes predominantly at the aperiodic multi-layered sequence and high loss due to the leakage into the substrate, each of the layers having one of a third refractive index and a fourth refractive index, the third refractive index being larger than the fourth refractive index; and wherein
    the first refractive index, the second refractive index, the third refractive index and the fourth refractive index are different, and
    the third refractive index is larger than the first refractive index and the fourth refractive index is larger than the second refractive index.

2. The device of claim 1, wherein
the aperiodic mode expansion sequence comprises five layer pairs, five layers of which have the first refractive index and the other five layers have the second refractive index, and
the aperiodic leakage controlling sequence comprises one of four and five layers having the third refractive index and five layers having the fourth refractive index.

3. The device of claim 1, wherein
the multi-layered sequence has non-uniform doping by n-type impurity with increased concentration in the layers of localization of the higher order modes contiguous to the substrate.

4. The device of claim 1, wherein
the edge-emitting semiconductor laser comprises heterostructures having one of III-V semiconductor material and II-VI semiconductor material, and
the heterostructures comprise one or multiple layers of one of quantum wells, quantum wires, and quantum dots as the active region.

5. The device of claim 1, wherein
the waveguide guides higher order modes localized at the plurality of aperiodic layer pairs with a confinement factor at the active layer smaller than that of the fundamental mode and with leakage losses into the substrate larger than that of the fundamental mode.

* * * * *

UNITED STATES PATENT AND TRADEMARK OFFICE
CERTIFICATE OF CORRECTION

PATENT NO. : 9,705,285 B2
APPLICATION NO. : 14/169520
DATED : July 11, 2017
INVENTOR(S) : Vladimir Kalosha and Dieter Bimberg Page 1 of 1

It is certified that error appears in the above-identified patent and that said Letters Patent is hereby corrected as shown below:

On the Title Page

The correct assignee should read: --(73) Assignee: PBC-Lasers GmbH, Berlin (DE)--.

Signed and Sealed this
Sixteenth Day of October, 2018

Andrei Iancu
*Director of the United States Patent and Trademark Office*